(12) United States Patent
Yeh et al.

(10) Patent No.: US 12,206,000 B2
(45) Date of Patent: Jan. 21, 2025

(54) HIGH ELECTRON MOBILITY TRANSISTOR AND METHOD FOR FORMING THE SAME

(71) Applicant: UNITED MICROELECTRONICS CORP., Hsin-Chu (TW)

(72) Inventors: Chih-Tung Yeh, Taoyuan (TW); Chun-Liang Hou, Hsinchu County (TW); Wen-Jung Liao, Hsinchu (TW); Chun-Ming Chang, Kaohsiung (TW); Yi-Shan Hsu, Taipei (TW); Ruey-Chyr Lee, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/416,764

(22) Filed: Jan. 18, 2024

(65) Prior Publication Data
US 2024/0162313 A1 May 16, 2024

Related U.S. Application Data

(60) Division of application No. 18/199,359, filed on May 18, 2023, which is a continuation of application No.
(Continued)

(30) Foreign Application Priority Data

Aug. 11, 2020 (CN) .......................... 202010799660.6

(51) Int. Cl.
*H01L 29/417* (2006.01)
*H01L 29/06* (2006.01)
(Continued)

(52) U.S. Cl.
CPC .... *H01L 29/4175* (2013.01); *H01L 29/66462* (2013.01); *H01L 29/7786* (2013.01);
(Continued)

(58) Field of Classification Search
CPC ............. H01L 29/0692; H01L 29/4175; H01L 29/66462; H01L 29/66431;
(Continued)

(56) References Cited

U.S. PATENT DOCUMENTS 7,601,993 B2 10/2009 Hoshi
8,242,539 B2 8/2012 Ohmaki
(Continued)

FOREIGN PATENT DOCUMENTS

CN 1983628 A 6/2007
CN 104282746 A 1/2015
(Continued)

OTHER PUBLICATIONS

Liu, "A Review of The METAL-GaN Contact Technology", Solid-State Electronics vol. 42, Issue 5, pp. 677-691, May 6, 1998.
(Continued)

*Primary Examiner* — Natalia A Gondarenko
(74) *Attorney, Agent, or Firm* — Winston Hsu

(57) ABSTRACT

A method for forming a high electron mobility transistor is disclosed. A mesa structure having a channel layer and a barrier layer is formed on a substrate. The mesa structure has two first edges extending along a first direction and two second edges extending along a second direction. A passivation layer is formed on the substrate and the mesa structure. A first opening and a plurality of second openings connected to a bottom surface of the first opening are formed and through the passivation layer, the barrier layer and a portion of the channel layer. In a top view, the first opening exposes the two first edges of the mesa structure without exposing the two second edges of the mesa structure. A metal layer is formed in the first opening and the second openings thereby forming a contact structure.

6 Claims, 18 Drawing Sheets

Related U.S. Application Data

17/029,075, filed on Sep. 23, 2020, now Pat. No. 11,695,049.

(51) Int. Cl.
  *H01L 29/20* (2006.01)
  *H01L 29/205* (2006.01)
  *H01L 29/40* (2006.01)
  *H01L 29/66* (2006.01)
  *H01L 29/778* (2006.01)

(52) U.S. Cl.
  CPC ...... *H01L 29/0684* (2013.01); *H01L 29/2003* (2013.01); *H01L 29/205* (2013.01); *H01L 29/401* (2013.01)

(58) Field of Classification Search
  CPC ......... H01L 29/66439; H01L 29/66469; H01L 29/7786; H01L 29/778–7789; H01L 29/775; H01L 29/7839; H01L 29/0684; H01L 29/2003; H01L 29/205; H01L 29/401; H01L 29/1066; H01L 29/41766; H01L 29/41725–41791; H01L 29/15–158; H01L 29/452; H01L 2924/13064; H01L 29/41775; H01L 29/41783; H01L 29/66575–66598; H01L 29/66606; H01L 29/66515; H01L 29/122–127
  USPC ............. 257/76, 77, 396, 201; 438/172, 478
  See application file for complete search history.

(56) References Cited

U.S. PATENT DOCUMENTS

| | | |
|---|---|---|
| 8,415,737 B2 | 4/2013 | Brar |
| 8,486,587 B2 | 7/2013 | Tsai |
| 9,275,933 B2 | 3/2016 | Kuo |
| 9,425,301 B2 | 8/2016 | Chiu |
| 9,748,139 B1 | 8/2017 | Liou |
| 9,761,791 B2 | 9/2017 | Shiu |
| 10,090,465 B2 | 10/2018 | Hsu |
| 11,695,049 B2 | 7/2023 | Yeh |
| 2007/0132037 A1 | 6/2007 | Hoshi |
| 2012/0156836 A1 | 6/2012 | Shealy |
| 2012/0280281 A1 | 11/2012 | Bahl |
| 2014/0306235 A1 | 10/2014 | Decoutere |
| 2015/0014699 A1 | 1/2015 | Motonobu |
| 2015/0318387 A1 | 11/2015 | Chiu |
| 2016/0071939 A1 | 3/2016 | Matsushita |
| 2016/0141404 A1 | 5/2016 | Tsai |
| 2019/0296137 A1 | 9/2019 | Yamada |
| 2020/0091302 A1 | 3/2020 | Akiyama |
| 2021/0043724 A1* | 2/2021 | Wu .................. H01L 29/432 |
| 2021/0234012 A1* | 7/2021 | Ono .................. H01L 29/2003 |

FOREIGN PATENT DOCUMENTS

| | | |
|---|---|---|
| CN | 105047707 A | 11/2015 |
| JP | 2009-239144 A | 10/2009 |

OTHER PUBLICATIONS

Lin, "Achieving sub-1 Ohm-mm Non-Recess S/D Contact Resistance in GaN HEMTs Utilizing Simple CMOS Compatible La/Ti/Al/Ti Metal Contacts", arXiv preprint arXiv:1902.00227, Feb. 1, 2019.

Zhang, "Mechanism of Ti/Al/Ti/W Au-free ohmic contacts to AlGaN/GaN heterostructures via pre-ohmic recess etching and low temperature annealing", Appl. Phys. Lett. 107, 262109 (2015), Dec. 30, 2015.

Greco, "Ohmic Contacts to Gallium Nitride materials", Applied Surface Science vol. 383, pp. 324-345, Oct. 15, 2016.

\* cited by examiner

HIGH ELECTRON MOBILITY TRANSISTOR AND METHOD FOR FORMING THE SAME

CROSS REFERENCE TO RELATED APPLICATIONS

This application is a division of U.S. application Ser. No. 18/199,359, filed on May 18, 2023, which is a continuation application of U.S. application Ser. No. 17/029,075, filed on Sep. 23, 2020. The contents of these applications are incorporated herein by reference.

BACKGROUND OF THE INVENTION

1. Field of the Invention

The invention relates to a high electron mobility transistor (HEMT) and method for forming the same. More particularly, the invention relates to a HEMT including a contact structure having a body portion and a plurality of protruding portions and method for forming the same.

2. Description of the Prior Art

A high electron mobility transistor (HEMT) is a new type of field effect transistor which is characterized for high switching speed and high response frequency. HEMTs have been widely used in technical fields such as power converters, low noise amplifiers, radio frequency (RF) or millimeter wave (MMW).

A high electron mobility transistor usually includes heterojunctions formed by bonding different materials having different band gaps. A two-dimensional electron gas (2 DEG) layer may be formed in the vicinity of the heterojunction that is utilized as a current channel region of the high electron mobility transistor. Among various semiconductor materials, group III-V compound semiconductors particularly gallium nitride (GaN) semiconductors have drawn great attentions as the materials for high frequency and high power applications for having wide band gaps and intrinsic spontaneous polarization and piezoelectric polarization. These specific characteristics of the GaN semiconductors allow a 2 DEG layer with high carrier density and high carrier mobility being formed near the heterojunction even when the GaN semiconductor layer is not doped. Nowadays, GaN transistors are on the rise to replace silicon-based transistors as the most popular transistors used in power switching technology.

To fulfill the increasing demands for higher frequency and lower power consumption, numerous efforts have been made to optimize the performance of HEMTs. It is known that on-resistance (Rdson) is one of the important factors affecting the switching speed and power loss of HEMTs. How to reduce the Rdson to improve the performance of the device is an important subject in the field.

SUMMARY OF THE INVENTION

The present invention is directed to provide a high electron mobility transistor (HEMT) and method for forming the same. The source electrode and the drain electrode of the HEMT provided by the present invention respectively include a contact structure having a body portion and a plurality of protruding portions connected to a bottom surface of the body portion. The contact structure may reduce the contact resistance (Rc) with the 2 DEG layer, so that the on-resistance (Rdson), the power loss and speed delay of the HEMT may be reduced. An improved performance of the HEMT may be may be obtained.

According to one embodiment of the present invention, a high electron mobility transistor is disclosed. A high electron mobility transistor includes a substrate, a mesa structure disposed on the substrate, a passivation layer disposed on the mesa structure, and at least a contact structure disposed in the passivation layer and the mesa structure. The mesa structure includes a channel layer, a barrier layer on the channel layer, two opposite first edges extending along a first direction, and two opposite second edges extending along a second direction. The contact structure includes a body portion and a plurality of protruding portions. The body portion penetrates through the passivation layer. The protruding portions penetrate through the barrier layer and a portion of the channel layer. In in a top view, the body portion overlaps the two opposite first edges of the mesa structure without overlapping the two opposite second edges of the mesa structure.

According to another embodiment of the present invention, a method for forming a high electron mobility transistor is disclosed. The method includes the following steps. First, a substrate is provided. Next, a mesa structure having a channel layer and a barrier layer on the channel layer is formed on the substrate. The mesa structure has two opposite first edges extending along a first direction, and two opposite second edges extending along a second direction. Following, a passivation layer is formed and covers the substrate and the mesa structure. Subsequently, at least a first opening and a plurality of second openings are formed in the passivation layer and the mesa structure. The first opening penetrates through the passivation layer and exposes the barrier layer, and in a top view, the first opening exposes the two opposite first edges of the mesa structure without exposing the two opposite second edges of the mesa structure. The second openings are connected to a bottom surface of the first opening and penetrate through the barrier layer and a portion of the channel layer. Following, a metal layer is formed in the first opening and the second openings thereby forming a contact structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2A, FIG. 2B and FIG. 3 to FIG. 10 are schematic diagrams illustrating the steps of a manufacturing method for forming a high electron mobility transistor according to one embodiment of the present invention, wherein FIG. 3, FIG. 5, FIG. 7 and FIG. 9 are top plane views, and FIG. 2A, FIG. 2B, FIG. 4, FIG. 6, FIG. 8 and FIG. 10 are cross-sectional views.

DETAILED DESCRIPTION

Figure 1:
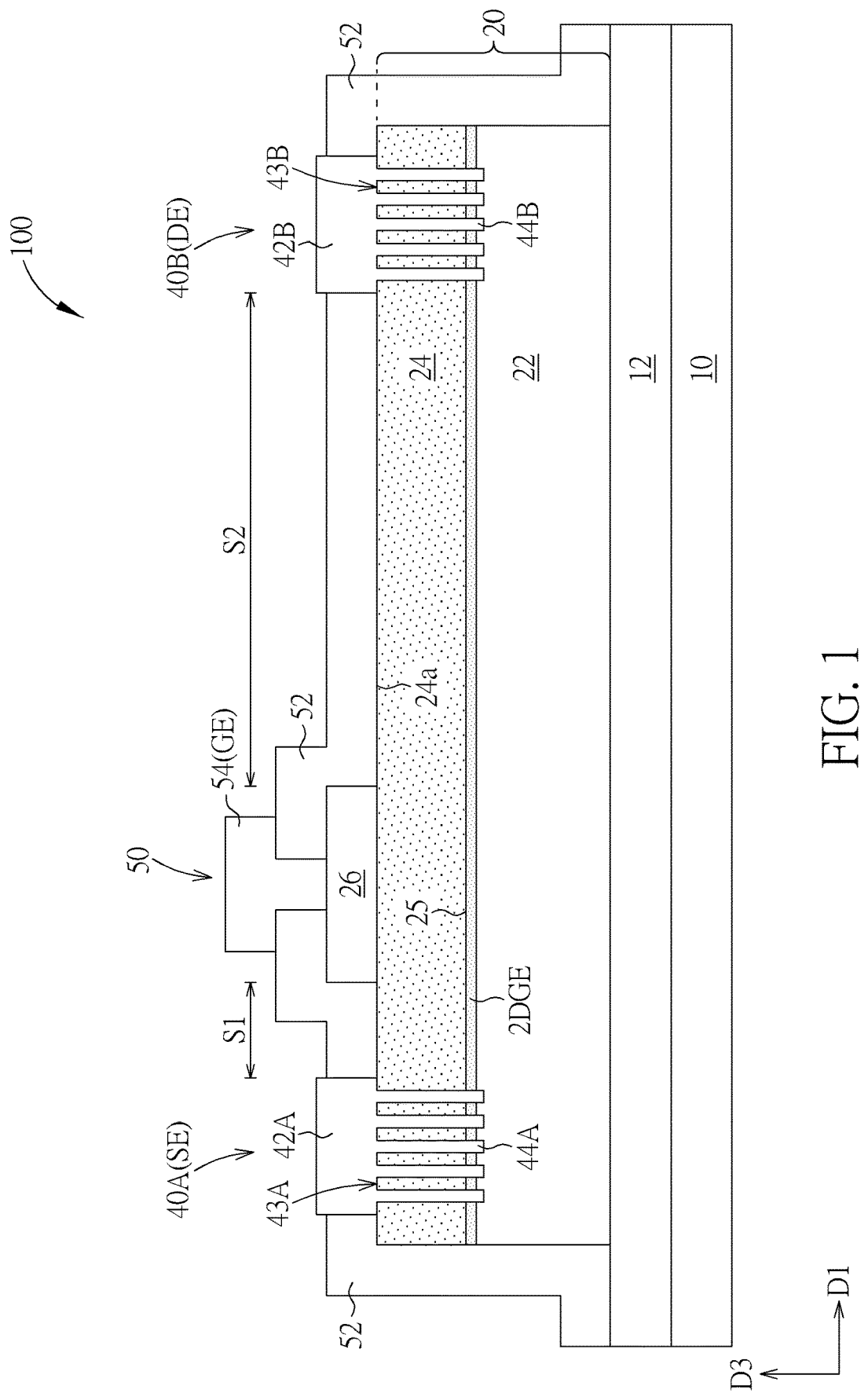
FIG. 1 is a schematic diagram illustrating a cross-sectional view of a high electron mobility transistor according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

The terms "wafer" and "substrate" used herein include any structure having an exposed surface onto which a layer is deposited according to the present invention, for example, to form the circuit structure. The term substrate is understood to include semiconductor wafers, but is not limited thereto. The term substrate is also used to refer to semiconductor structures during processing, and may include other layers that have been fabricated thereupon.

The high electron mobility transistor (HEMT) provided by the present invention may be a depletion mode (normally-on) transistor or an enhancement mode (normally-off) transistor. The HEMT provided by the present invention may be used in power converters, low noise amplifiers, radio frequency (RF) or millimeter wave (MMW) and other technical fields.

Please refer to FIG. 1, which is a schematic diagram illustrating a cross-sectional view of a high electron mobility transistor (HEMT) 100 along a first direction D1 and a second direction D2 according to an embodiment of the present invention. As shown in FIG. 1, the high electron mobility transistor 100 includes a substrate 10. A buffer layer 12 is disposed on the substrate 10. A mesa structure 20 is disposed on the buffer layer 12. A passivation layer 52 covers the mesa structure 20 and the substrate 10. A gate structure 50 is disposed on the mesa structure 20 and penetrates through the passivation layer 52. A contact structure 40A and a contact structure 40B are respectively disposed on two sides of the gate structure 50 along the first direction D1.

In some embodiments, the substrate 10 may include a silicon substrate, a silicon carbide (SiC) substrate, a sapphire substrate, a gallium nitride substrate, an aluminum nitride substrate, or a substrate made of other suitable materials. The buffer layer 12 is disposed on the substrate 10 and is used as a transition region between the substrate 10 and the mesa structure 20 to reduce the generation of the lattice dislocation or defects in the mesa structure 20. In some embodiments, the material of the buffer layer 12 may include gallium nitride (GaN), aluminum gallium nitride (AlGaN), aluminum indium nitride (AlInN), aluminum gallium indium nitride (AlGaInN), or aluminum nitride (AlN), but is not limited thereto. The mesa structure 20 is disposed on the buffer layer 12 and includes a heterojunction semiconductor stack. For example, the mesa structure 20 may include a channel layer 22 and a barrier layer 24 disposed on the channel layer 22. The barrier layer 24 and the channel layer 22 have different band gaps and different lattice constants. The energy band near the junction 25 of the barrier layer 24 and the channel layer 22 is bent and forms a potential well in the channel layer 22. The carriers (such as electrons) in the channel layer 22 may converge in the potential well, so that a two-dimensional electron gas layer 2 DEG having high carrier density and high carrier mobility may be formed in the channel layer 22 immediately below the junction 25. The two-dimensional electron gas layer 2 DEG may serve as a current channel between the source electrode SE and the drain electrode DE of the high electron mobility transistor 100.

According to an embodiment of the present invention, the material of the channel layer 22 may include gallium nitride (GaN), aluminum gallium nitride (AlGaN), aluminum indium nitride (AlInN), indium gallium nitride (InGaN), aluminum gallium indium nitride (AlGaInN), or a combination thereof, but is not limited thereto. The material of the barrier layer 24 may include aluminum gallium nitride (AlGaN), aluminum indium nitride (AlInN), aluminum gallium indium nitride (AlInGaN), aluminum nitride (AlN), or a combination thereof, but is not limited thereto. According to a preferred embodiment, the channel layer 22 includes gallium nitride (GaN), and the barrier layer 24 includes aluminum gallium nitride (AlGaN).

In some embodiments, the channel layer 22 and the barrier layer 24 may respectively have a superlattice structure including multiple semiconductor thin layers. By selecting the materials and adjusting the thickness of each of the semiconductor thin layers, the band structure, the strength of the polarization field and/or the carrier distribution near the junction 25 may be adjusted, thereby adjusting the carrier distribution and carrier mobility of the two-dimensional electron gas layer 2 DEG for product requirements.

The passivation layer 52 covers the mesa structure 20 and serves as the isolation and passivation layer for the mesa structure 20. Furthermore, the passivation layer 52 may suppress gate leakage current of the high electron mobility transistor 100. In some embodiments, the material of the passivation layer 52 may include aluminum nitride (AlN), aluminum oxide ($Al_2O_3$), boron nitride (BN), silicon nitride ($Si_3N_4$), silicon oxide ($SiO_2$), zirconia ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, other suitable dielectric materials, or a combination thereof, but is not limited thereto.

The gate structure 50 is disposed on the mesa structure 20 and between the contact structure 40A and the contact structure 40B. The gate structure 50 controls the current of the two-dimensional electron gas layer 2 DEG of the high electron mobility transistor 100. The gate structure of the high electron mobility transistor 100 may be a metal gate or a metal-semiconductor gate according to design needs. For example, the gate structure 50 shown in FIG. 1 is a metal-semiconductor gate, which includes a semiconductor gate layer 26 and a metal layer 54 disposed on the semiconductor gate layer 26. The semiconductor gate layer 26 may include group III-V compound semiconductors. The semiconductor gate layer 26 may have an n-type (negative type) conductivity or a p-type (positive type) conductivity according to the application needs. The built-in voltage of the semiconductor gate layer 26 may pull up the potential well near the junction 25 of the barrier layer 24 and the channel layer 22, thereby obtaining a normally-off operation of the high electron mobility transistor 100. According to an embodiment of the present invention, the semiconductor gate layer 26 may include p-type gallium nitride (p-GaN) having dopants such as magnesium (Mg), iron (Fe) or other suitable p-type dopants. The metal layer 54 of the gate structure 50 is the gate electrode GE of the high electron mobility transistor 100. The metal layer 54 may include, for example, gold (Au), tungsten (W), cobalt (Co), nickel (Ni), titanium (Ti), molybdenum (Mo), copper (Cu), aluminum (Al), tantalum (Ta), Palladium (Pd), platinum (Pt), a compounds of the above materials, a composite layer of the above materials or an alloy of the above materials, but is not limited thereto.

In other embodiments of the present invention, the gate structure of the high electron mobility transistor 100 may be a metal gate, which may be formed completely over the mesa structure 20 or partially embedded in the mesa structure 20 (such as in the barrier layer 24) to form a recessed gate. If the gate structure is a metal gate, a gate dielectric layer may be provided between the gate structure and the mesa structure 20.

The contact structure 40A and the contact structure 40B are respectively disposed on two sides of the gate structure 50 to form the source electrode SE and the drain electrode DE of the high electron mobility transistor 100. The contact structure 40A and the contact structure 40B respectively penetrate through the passivation layer 52 and extend downward to penetrate through the barrier layer 24 of the mesa structure 20 and are in direct contact with the channel layer 22. The materials of the contact structure 40A and the contact structure 40B may include metals or other suitable conductive materials. For example, the materials of the contact structure 40A and the contact structure 40B may include gold (Au), tungsten (W), cobalt (Co), nickel (Ni), titanium (Ti), molybdenum (Mo), copper (Cu), aluminum (Al), tantalum (Ta), Palladium (Pd), platinum (Pt), a compounds of the above materials, a composite layer of the above materials or an alloy of the above materials, but is not limited thereto. The metal layer 54 of the gate structure 50, the contact structure 40A and the contact structure 40B may include the same or different conductive materials according to product needs. As shown in FIG. 1, the contact structure 40A and the semiconductor gate layer 26 may have a distance S1; the contact structure 40B and the semiconductor gate layer 26 may have a distance S2. The distance S1 may be substantially equal to or different from the distance S2. In some embodiments, by adjusting the ratio of the distance S1 and the distance S2, the stress and/or the electric field of the contact structure 40A and the contact structure 40B applied to the high electron mobility transistor 100 may be adjusted, thereby optimizing the electrical parameters of the high electron mobility transistor 100, The electrical parameters, for example, may include threshold voltage, on-current, leakage current, and breakdown voltage, but is not limited thereto. In the embodiment shown in FIG. 1, the distance S2 between the contact structure 40B (drain electrode DE) and the semiconductor gate layer 26 is greater than the distance S1 between the contact structure 40A (source electrode SE) and the semiconductor gate layer 26. In other embodiments of the present invention, the distance S2 may be substantially equal to or smaller than the distance S1.

Please continue to refer to FIG. 1. It is noteworthy that the contact structure 40A includes a body portion 42A and a plurality of protruding portions 44A connected to the bottom surface 43A of the body portion 42A. In some embodiments, the contact structure 40B also includes a body portion 42B and a plurality of protruding portions 44B connected to the bottom surface 43B of the body portion 42B. More specifically, the top end of the body portion 42A and the top end of the body portion 42B are exposed from the top surface of the mesa structure 20 for electrically connecting to the outside, and the bottom end of the body portion 42A and the bottom end of the body portion 42B penetrate through the passivation layer 52 and are in direct contact with the barrier layer 24 of the mesa structure 20. The protruding portions 44A and the protruding portions 44B extend downward (extending toward the substrate 10) from the bottom surface 43A of the body portion 42A and the bottom surface 43B of the body portion 42B, respectively, and penetrate through the barrier layer 24 and are in direct contact the channel layer 22. The protruding portions 44A and the protruding portions 44B further extend downward through the two-dimensional electron gas layer 2 DEG near junction 25.

The dimensions and shapes of the contact structure 40A and the contact structure 40B may be adjusted according to design needs. For example, the widths of the body portion 42A and the body portion 42B along the first direction D1 and the numbers of the protruding portions 44A and the protruding portions 44B may be adjusted. In some embodiments, the body portion 42A of the contact structure 40A and the body portion 42B of the contact structure 40B may have a same width, and the number of protruding portions 44A and the number of the protruding portions 44B may be the same. In other embodiments of the present invention, the body portion 42A of the contact structure 40A and the body portion 42B of the contact structure 40B may have different widths along the first direction D1, and the number of protruding portions 44A and the number of the protruding portions 44B may be different.

The depths of the contact structure 40A and the contact structure 40B extending in the mesa structure 20 may be adjusted according to design needs. For example, in some embodiments, the body portion 42A and the body portion 42B extend through the passivation layer 52 and are in direct contact with the barrier layer 24. The bottom surface 43A of the body portion 42A and the bottom surface 43B of the body portion 42B may be substantially flush with the upper surface 24a of the barrier layer 24 along the first direction D1.

In some embodiments, the body portion 42A and the body portion 42B may extend downward through a portion of the barrier layer 24. The bottom surface 43A of the body portion 42A and the bottom surface 43B of the body portion 42B may be located lower than the upper surface 24a of the barrier layer 24 and higher than the upper surface of the channel layer 22. The bottom surface 43A and the bottom surface 43B may be located between the upper surface 24a and the junction 25.

In some embodiments, the bottom surface 43A of the body portion 42A and the bottom surface 43B of the body portion 42B may be located at different depths in the mesa structure 20, and are not flush with each other along the first direction D1. In some embodiments, the bottom surface 43A of the body portion 42A may be located lower than the bottom surface 43B of the body portion 42B. In some embodiments, the bottom surface 43A of the body portion 42A may be located higher than the bottom surface 43B of the body portion 42B.

In some embodiments, the protruding portions 44A and the protruding portions 44B may extend to the same depth in the mesa structure 20. In some embodiments, the bottom surfaces of the protruding portions 44A and the bottom surfaces of the protruding portions 44B may be substantially flush with each other along the first direction D1.

In some embodiments, the protruding portions 44A and the protruding portions 44B may extend to different depths in the mesa structure 20, and the bottom surfaces of the protruding portions 44A and the protruding portions 44B are not flush with each other along the first direction D1. In some embodiments, the bottom surfaces of the protruding portions 44A may be located lower than the bottom surfaces of the protruding portions 44B. In some embodiments, the bottom surfaces of the protruding portions 44A may be higher than the bottom surfaces of the protruding portions 44B.

One feature of the contact structure exemplified above is that, the body portion of the contact structure extends through the passivation layer and is in direct contact with the barrier layer, and the protruding portions connected to the bottom surface of the body portion extend through the barrier layer and a portion of the channel layer. This design allows the material of the contact structure (such as metal) to provide stress to the barrier layer and/or the channel layer of the mesa structure, thereby adjusting the piezoelectric polarization of the channel layer. Additionally, by making the protruding portions extending through the two-dimensional electron gas layer and being surrounded by the two-dimensional electron gas layer, the contact resistance (Rc) between the contact structure and the two-dimensional electron gas layer may be reduced. The present invention may adjust the carrier density and carrier mobility of the two-dimensional electron gas layer near the heterojunction by the contact structure. In this way, the on-resistance (Rdson), power loss and speed delay of the high electron mobility transistor may be reduced accordingly. A high electron mobility transistor with improved performance may be obtained. The shapes (such as rectangular, circular, elliptical, parallelogram, or other shapes in the top plane view) the body portion and the associated protruding portions, the arrangement of the protruding portions and the density of the protruding portions may also be designed according to different product needs and performance requirements.

The following description will detail the manufacturing process of the HEMT 100 of the present invention. To simplify the description, identical components in the diagrams are marked with identical symbols to facilitate the understanding of the diagrams. Examples of the materials used for each component may be explicit by referring to the previous description, and will not be repeated below.

FIG. 2A, FIG. 2B and FIG. 3 to FIG. 10 are schematic diagrams illustrating the steps of a manufacturing method for forming a high electron mobility transistor according to one embodiment of the present invention. FIG. 3, FIG. 5, FIG. 7 and FIG. 9 are top plane views of the high electron mobility transistor along the first direction D1 and the second direction D2. FIG. 2A, FIG. 2B, FIG. 4, FIG. 6, FIG. 8 and FIG. 10 are cross-sectional views of the high electron mobility transistor along the first direction D1 and the third direction D3. The first direction D1 and the second direction D2 are perpendicular to each other. The third direction D3 is substantially perpendicular to the plane defined by the first direction D1 and the second direction D2.

Figure 2A:
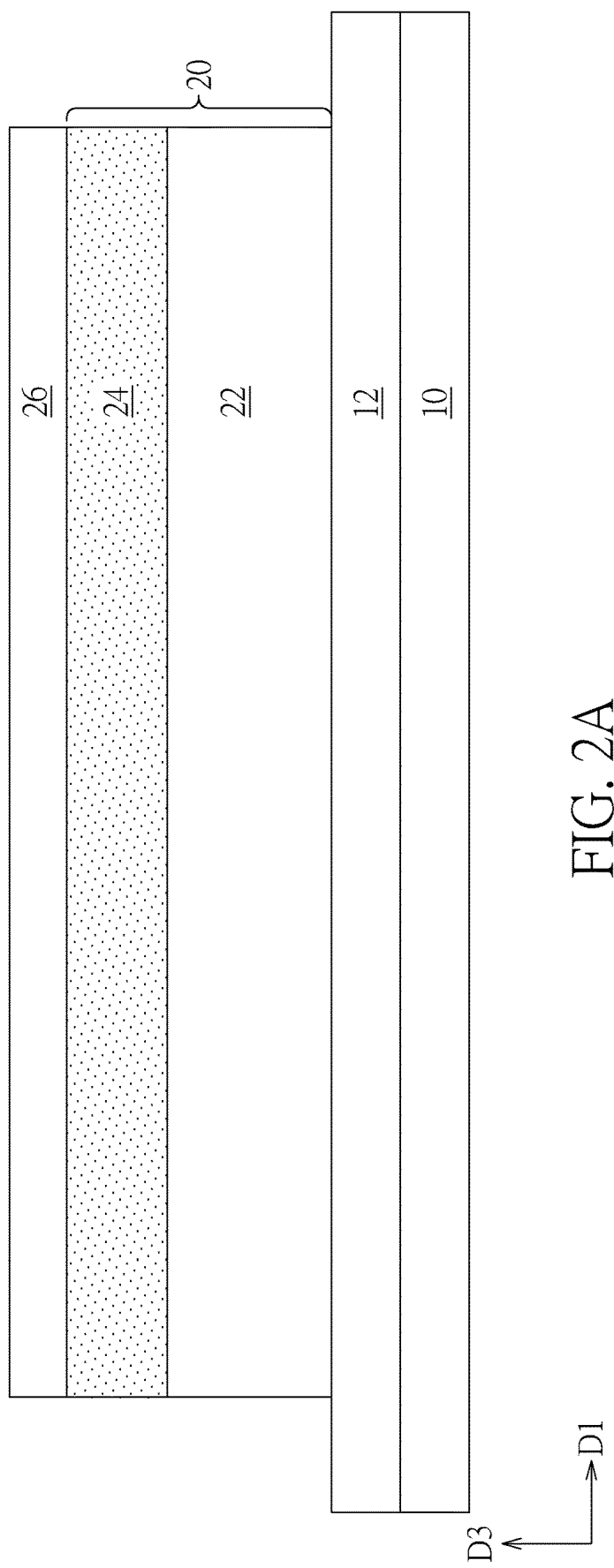

Please refer to FIG. 2A. First, a substrate 10 is provided. Next, a buffer layer 12, a channel layer 22, a barrier layer 24 and a semiconductor gate layer 26 are successively formed on the substrate 10. Subsequently, a patterning process is performed to pattern the channel layer 22, the barrier layer 24 and the semiconductor gate layer 26 to form a mesa structure 20 on the buffer layer 12 and covered by the patterned semiconductor gate layer 26. According to some embodiments, the buffer layer 12, the channel layer 22, the barrier layer 24 and the semiconductor gate layer 26 may be successively formed on the substrate 10 by performing a heteroepitaxy growth process. The heteroepitaxy growth process may include molecule beam epitaxy (MBE), metal-organic chemical vapor deposition (MOCVD), or hydride vapor phase deposition (HVPE), but is not limited thereto. A seed layer (not shown) may be formed on the substrate 10 before forming the buffer layer 12.

Figure 2B:
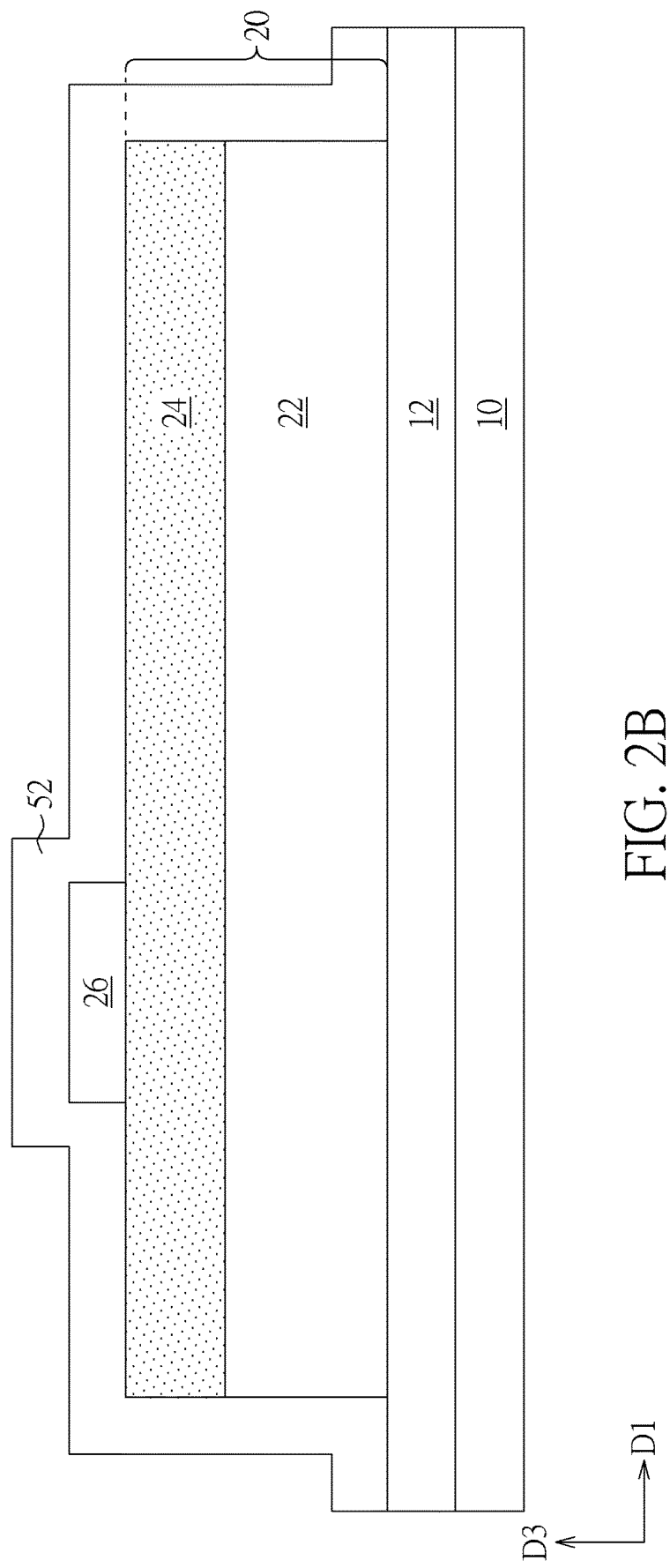

Please refer to FIG. 2B. Next, a subsequent patterning process is performed on the semiconductor gate layer 26 to remove unnecessary portions of the semiconductor gate layer 26. A passivation layer 52 is then formed on the substrate 10 and covers the mesa structure 20 and the semiconductor gate layer 26. The passivation layer 52 may be formed by atomic layer deposition (ALD), plasma enhanced atomic layer deposition (PEALD), chemical vapor deposition (CVD), plasma enhanced chemical vapor deposition (PECVD), and low pressure chemical vapor deposition (LPCVD), but is not limited thereto. The portion of the passivation layer 52 covering the semiconductor gate layer 26 may have a step-shaped cross-sectional profile.

Figure 3:
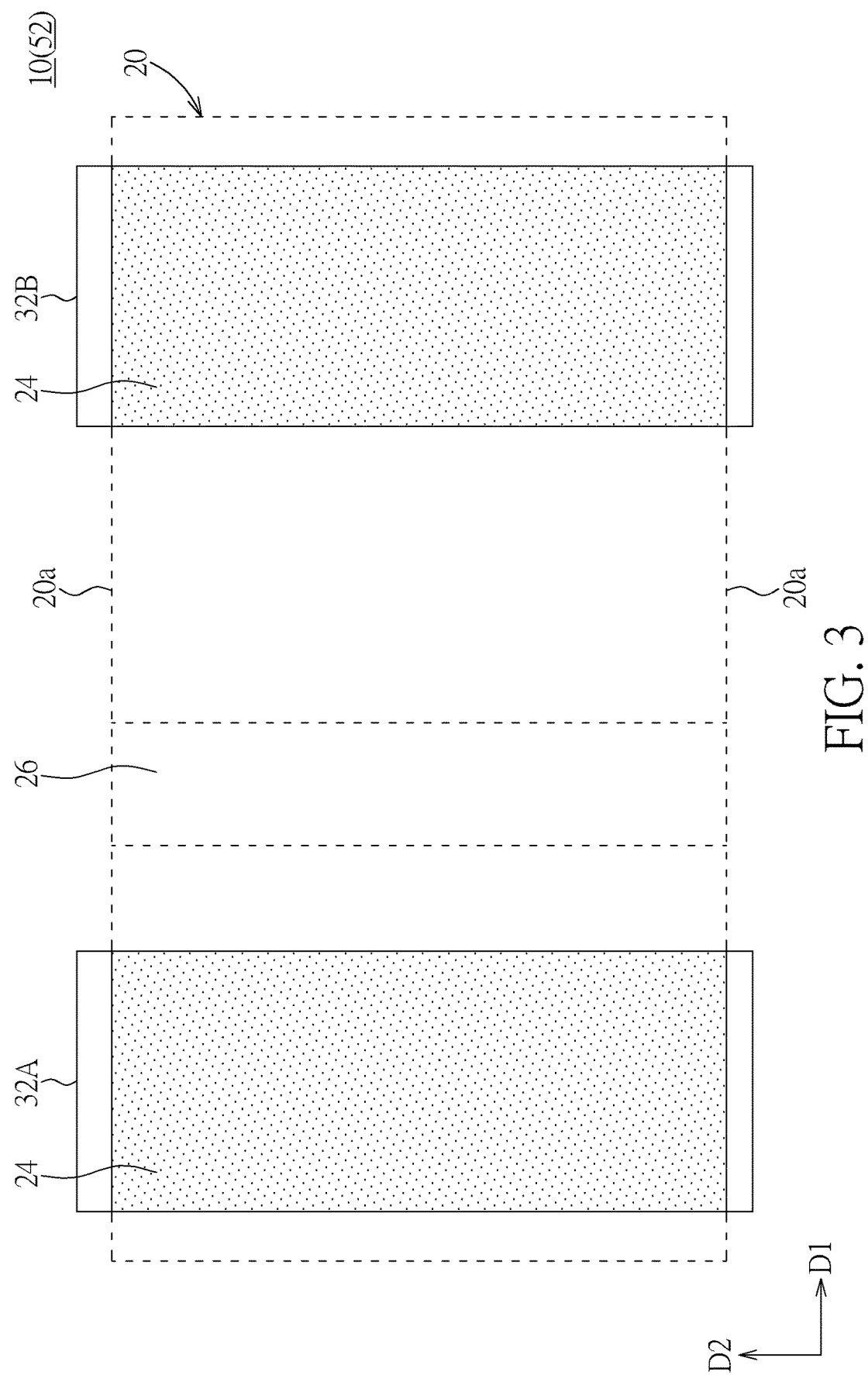
Figure 4:
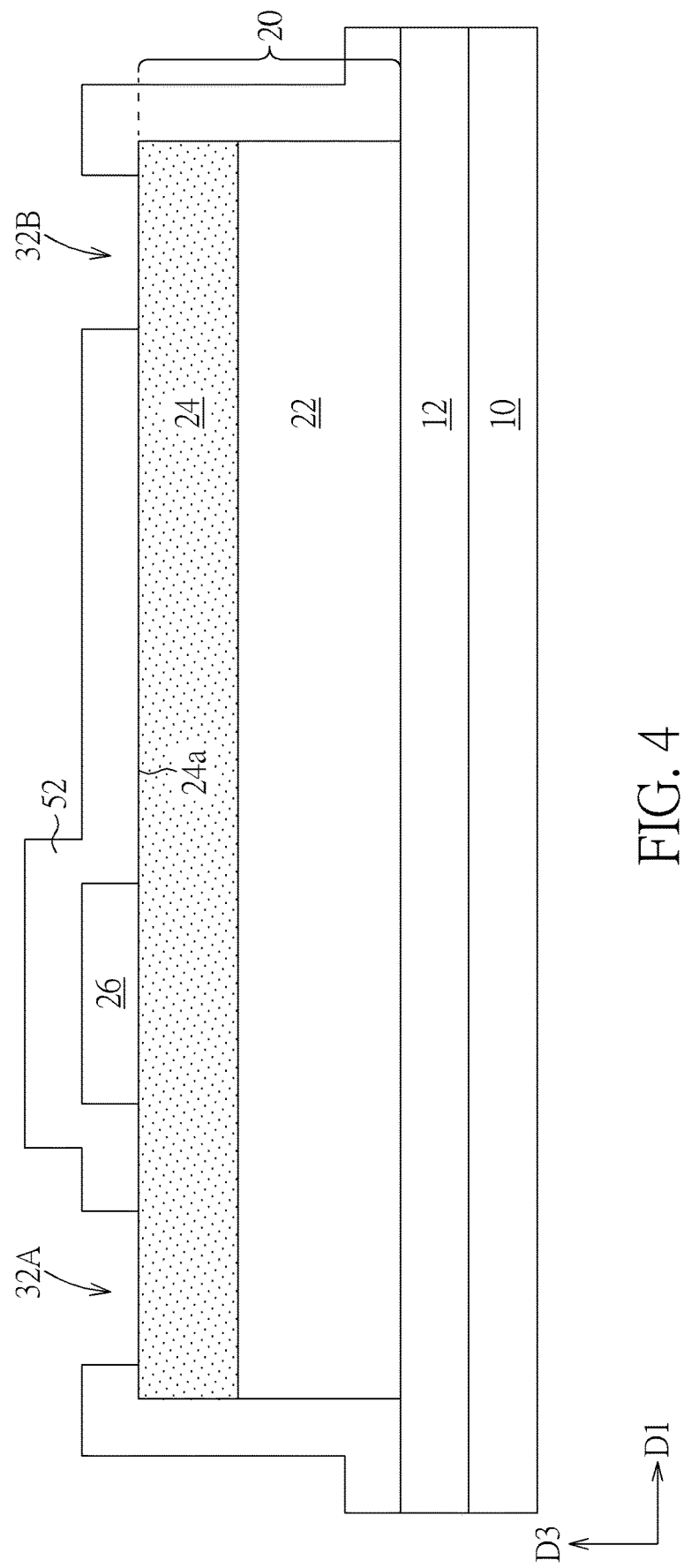

Please refer to FIG. 3 and FIG. 4. Next, a subsequent patterning process is performed to form a first opening 32A and a first opening 32B in the passivation layer 52 to expose portions of the barrier layer 24. In some embodiments, the patterning process may include a photolithography-etching process that includes the steps of, for example, forming a photoresist layer on the substrate 10 and covering the mesa structure 20, forming openings in the photoresist layer to expose portions of the passivation layer 52, performing an etch process using the photoresist layer as an etching mask to remove the exposed portions of the passivation layer 52 to form the first opening 32A and the first opening 32B, and then removing the remaining photoresist layer on the substrate 10. In some embodiments, the passivation layer 52 may be etched by inductively-coupled plasma reactive ion etching (ICP-RIE) process, but is not limited thereto. In some embodiments, the etching process for forming the first opening 32A and the first opening 32B may stop as soon as the barrier layer 24 is exposed from the first opening 32A and the first opening 32B, and the bottom surfaces of the first opening 32A and the first opening 32B may be substantially flush with the upper surface 24a of the barrier layer 24. In some embodiments, the etching process for forming the first opening 32A and the first opening 32B may etch a portion of the exposed barrier layer 24 and the first opening 32A and the first opening 32B are extended into the barrier layer 24. Therefore, the bottom surfaces of the first opening 32A and the first opening 32B may be located lower than the upper surface 24a of the barrier layer 24.

As shown in FIG. 3, along the first direction D1, the first opening 32A and the first opening 32B are respectively disposed on two sides of the semiconductor gate layer 26. In some embodiments, along the second direction D2, the lengths of the first opening 32A and the first opening 32B may be larger than the length of the mesa structure 20. The first opening 32A and the first opening 32B respectively overlap two edges 20a of the mesa structure 20.

Figure 5:
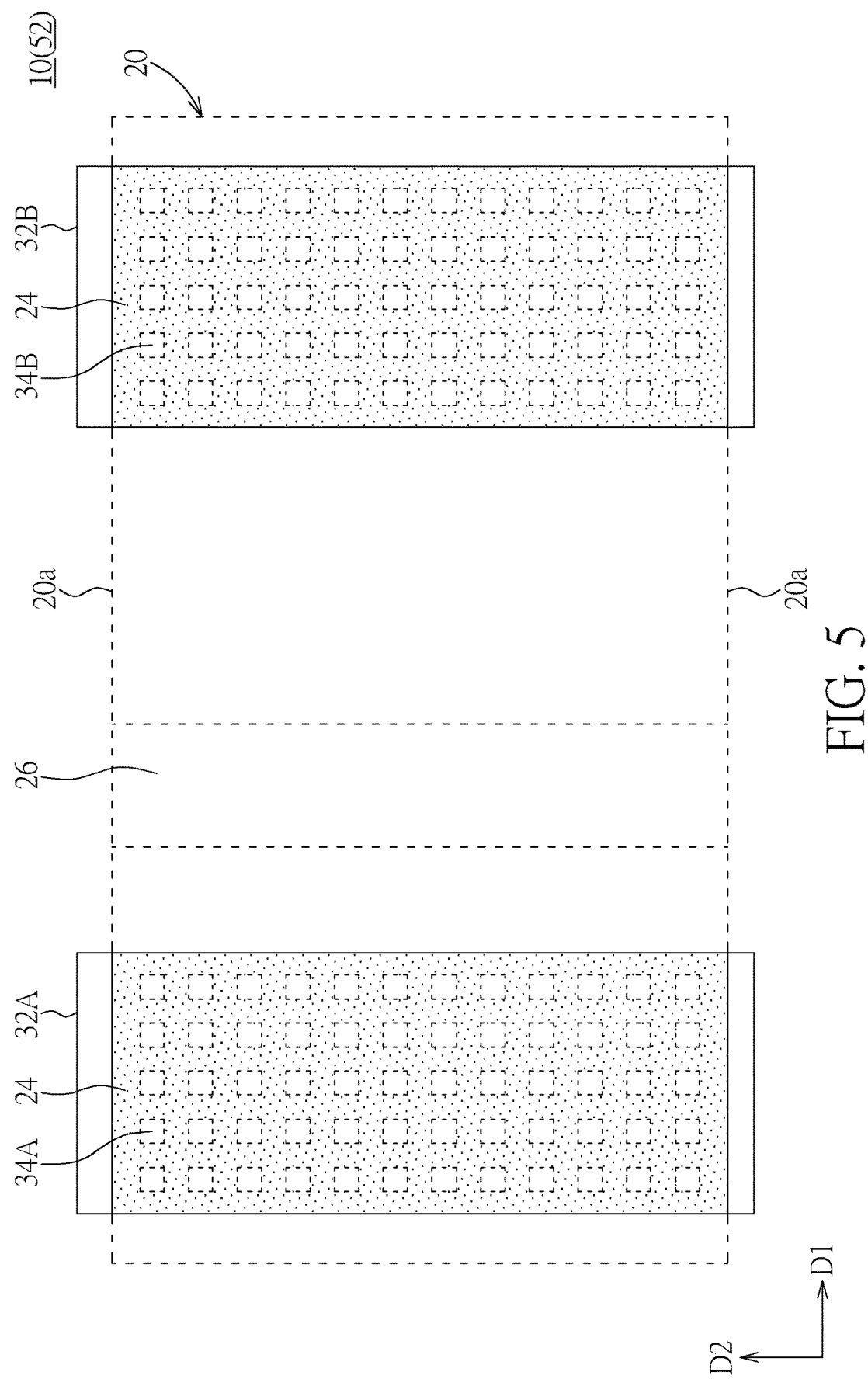
Figure 6:
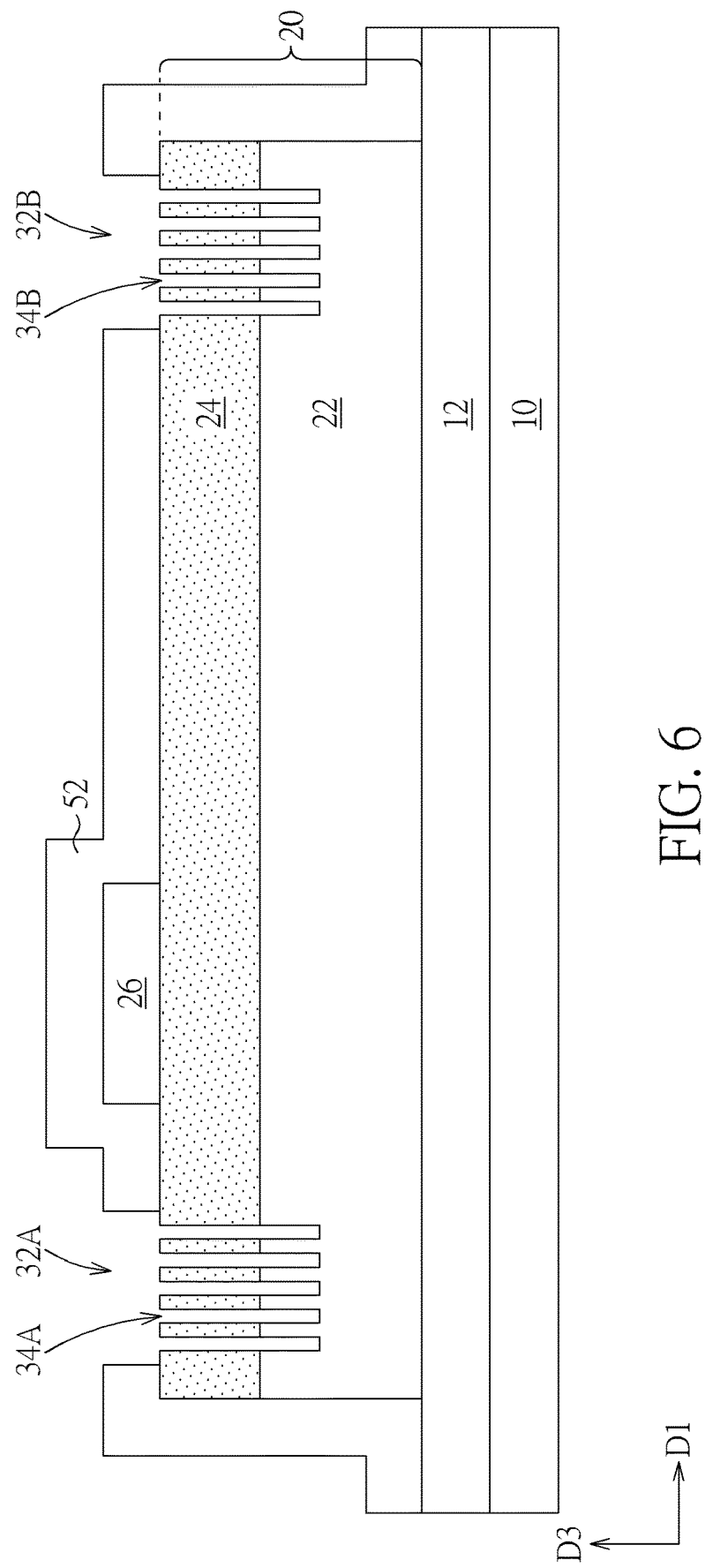

Please refer to FIG. 5 and FIG. 6. Next, a plurality of second openings 34A and a plurality of second openings 34B are respectively formed in the first opening 32A and the first opening 32B. The second openings 34A and the second openings 34B may be formed by performing a patterning process, such as a photolithography-etching process that includes the steps of, for example, forming a photoresist layer on the substrate 10 and the mesa structure 20 and filling the first opening 32A and the first opening 32B, forming openings in the photoresist layer to expose portions of the barrier layer 24, performing an etch process (such as an ICP-RIE process) using the photoresist layer as an etching mask to remove the exposed portions of the barrier layer 24 and the channel layer 22 to form the second openings 34A and the second openings 34B, and then removing the remaining photoresist layer.

In the top plane view as shown in FIG. 5, the second openings 34A are evenly distributed in the overlapping region of the first opening 32A and the mesa structure 20, and are arranged along the first direction D1 and the second direction D2 to form an array that is distanced from the edge 20a of the mesa structure 20 by a distance. The second openings 34B, as well as the second openings 34A, are evenly distributed in the overlapping region of the first opening 32B and the mesa structure 20, and are arranged along the first direction D1 and the second direction D2 to form an array that is distanced from the edge 20a of the mesa structure 20 by a distance. The second openings 34A and the second openings 34B may have rectangular shapes as shown in FIG. 5. In other embodiments, the shapes of the second openings 34A and the second openings 34B may be circular, elliptical, parallelogram, or other shapes according to design needs. The array density of the second opening 34A and the second opening 34B may be adjusted as required. According to some embodiments, in a top plane view, the total area of the second openings 34A may be between 25% and 50% of the area of the overlapping region of the first opening 32A and the mesa structure 20. The total area of the second openings 34B may be between 25% and 50% of the area of the overlapping region of the first opening 32B and the mesa structure 20.

It should be noted that the sequence of forming the first openings and the second openings are not limited to the example illustrated in FIG. 3, FIG. 4, FIG. 5 and FIG. 6. In some embodiments, the second openings may be formed in the mesa structure before forming the first openings. For example, a first photolithography-etching process may be first carried out to form the second openings that penetrate through the passivation layer and the barrier and extend into part of the channel layer, and then a second photolithography-etching process may be carried out to form the first openings that penetrate through the passivation layer.

Figure 7:
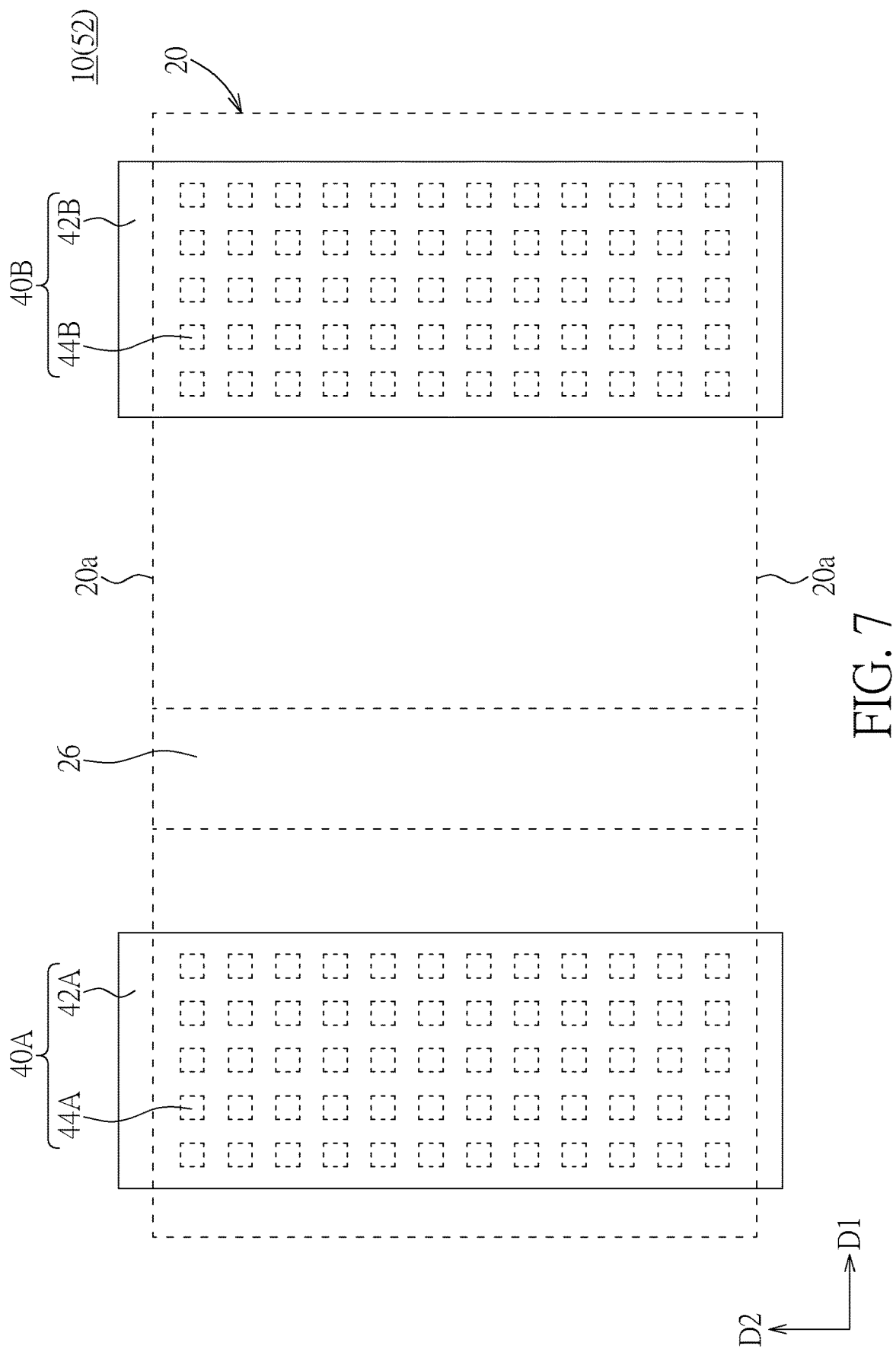
Figure 8:
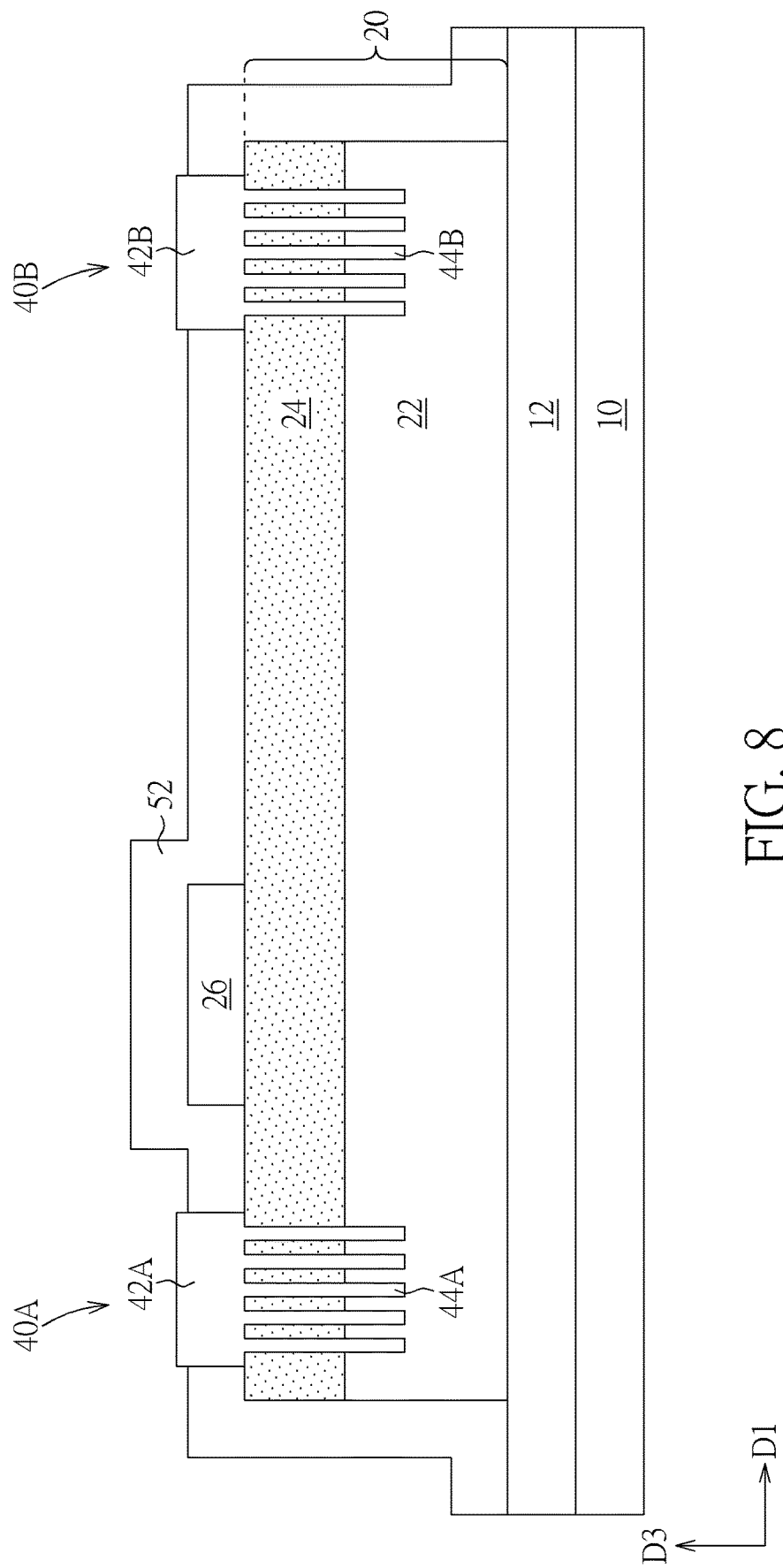

Please refer to FIG. 7 and FIG. 8. Subsequently, a metal layer is formed on the mesa structure 20 and fills the first openings 32A, 32B and the second openings 34A, 34B. The metal layer is then patterned to remove unnecessary portions outside the openings, thereby obtaining the contact structure 40A and the contact structure 40B. In some embodiments, the metal layer may be patterned by performing a metal lift-off process or a photolithography-etching process. The metal lift-off process, for example, may include the following steps. First, a photoresist layer is formed on the substrate 10 and the mesa structure 20. The photoresist layer is patterned to form openings to expose the first openings 32A, 32B and the second openings 34A, 34B. The metal layer to form the contact structure 40A and the contact structure 40B is then deposited on the photoresist layer in a blanket manner and fills the first openings 32A, 32B and the second openings 34A, 34B. The metal layer may be formed by, for example, electron beam evaporation or sputtering process. After that, a solvent treatment is performed on the substrate 10 to lift off the photoresist layer so that the portion of the metal layer on the photoresist layer is concurrently removed, thereby a patterned metal layer may be obtained. The portions of the metal layer remaining in the first openings 32A, 32B and the second openings 34A, 34B are the contact structure 40A and the contact structure 40B. Otherwise, in other embodiments of the present invention, after forming the first openings 32A, 32B and the second openings 34A, 34B, a metal layer may be directly deposited on the substrate 10 and covers the mesa structure 20, and a photolithography-etching process is then performed to remove unnecessary portions of the metal layer outside the first openings 32A, 32B and the second openings 34A, 34B to form the contact structure 40A and the contact structure 40B.

According to the above illustration, it should be noted that the first openings and the second openings of the present invention are formed in the mesa structure by performing two different patterning processes, and a metal layer is then filled into the first openings and the second openings to produce the contact structure having a one-piece structure.

Figure 9:
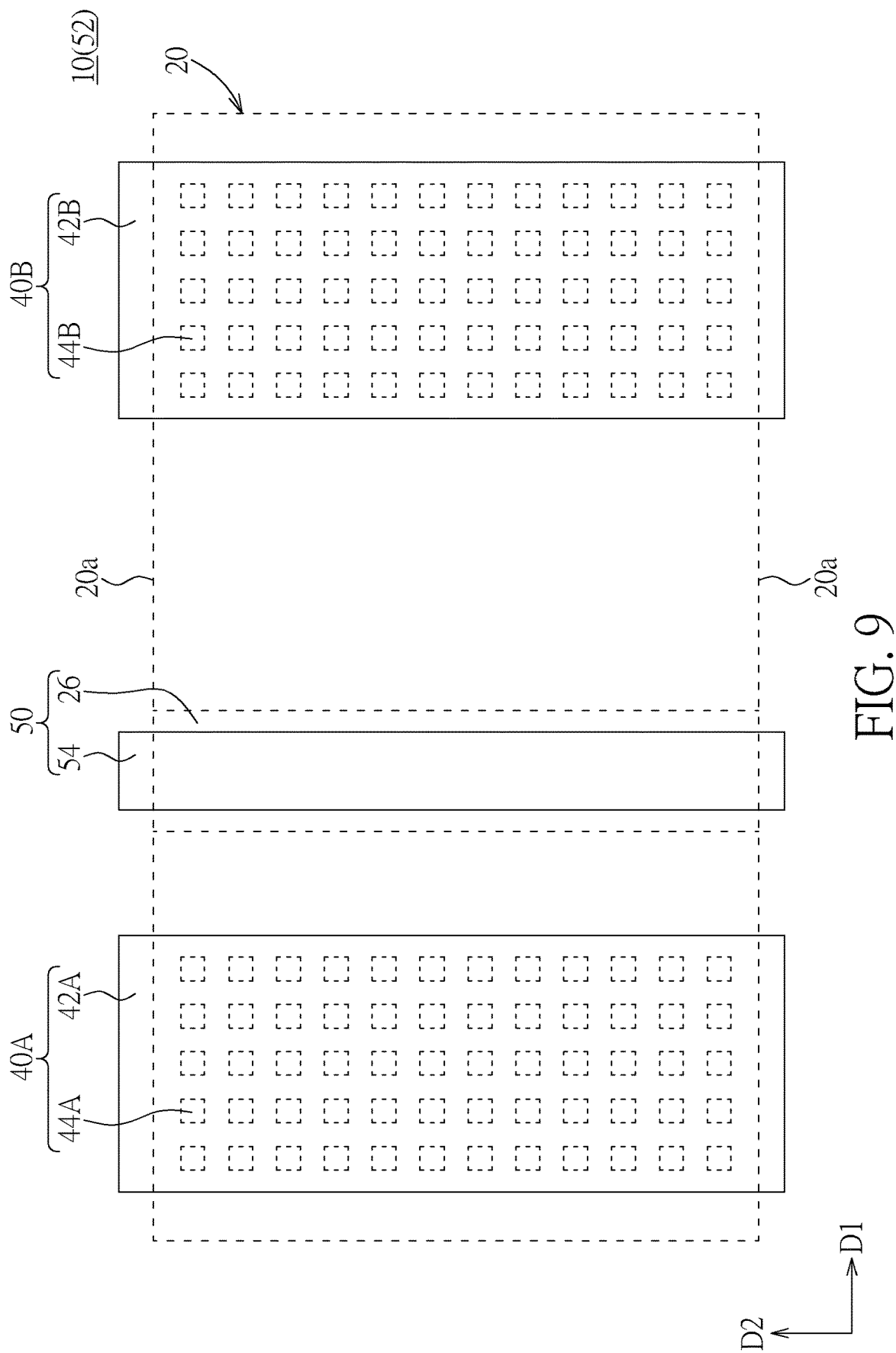
Figure 10:
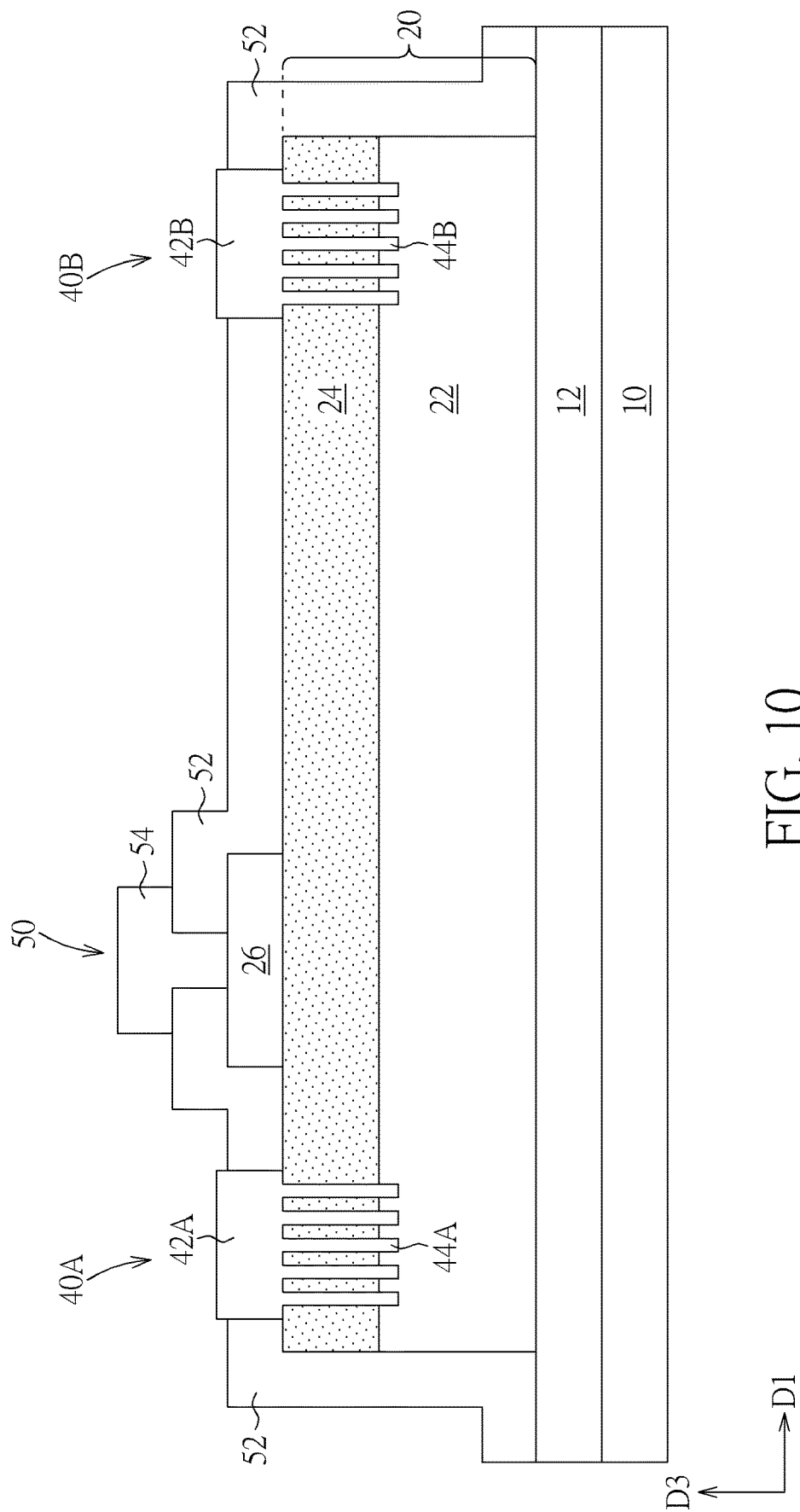

Please refer to FIG. 9 and FIG. 10. Next, a subsequent patterning process is performed to define a gate opening in the passivation layer 52 directly over the semiconductor gate layer 26 and to expose a portion of the semiconductor gate layer 26. A metal layer 54 is then formed on the passivation layer 52, fills the gate opening and is in directly contact with the semiconductor gate layer 26. In other embodiments of the present invention, the gate opening may be formed concurrently with the first openings 32A and 32B and the metal layer for forming the contact structure 40A and 40B may also fill the gate opening to form the metal layer 54 of the gate structure 50. In some embodiments, as shown in FIG. 10, the metal layer 54 may have a T-shaped cross-sectional profile. A part of the passivation layer 52 is sandwiched between the semiconductor gate layer 26 and the metal layer 54.

In the top plane view as shown FIG. 9, the body portion 42A and the body portions 42B respectively overlap two edges 20a of the mesa structure 20. The protruding portions 44A are evenly distributed in the overlapping region of the body portion 42A and the mesa structure 20, and are arranged along the first direction D1 and the second direction D2 to form an array that is distanced from the edge 20a of the mesa structure 20 by a distance. The protruding portions 44B, as well as the protruding portions 44A, are evenly distributed in the overlapping region of the body portion 42B and the mesa structure 20, and are arranged along the first direction D1 and the second direction D2 to form an array that is distanced from the edge 20*a* of the mesa structure 20 by a distance. The shapes of the protruding portions 44A and the protruding portions 44B are determined by the shapes of the second openings 34A and the second openings 34B, and may be rectangular as shown in FIG. 9. In other embodiments of the present invention, the shapes of the protruding portions 44A and the protruding portions 44B may be circular, elliptical, parallelogram, or other shapes according to design needs. According to an embodiment of the present invention, in a top plane view, the total area of the protruding portions 44A may be between 25% and 50% of the area of the overlapping region of the body portion 42A and the mesa structure 20, and the total area of the protruding portions 44B may be between 25% and 50% of the area of the overlapping region of the body portion 42B and the mesa structure 20.

The gate structure 50 is located between the contact structure 40A and the contact structure 40B and has a length extending along the second direction D2. The gate structure 50 overlaps the two edges 20*a* of the mesa structure 20.

In the cross-sectional view as shown FIG. 10, the contact structure 40A includes the body portion 42A filling the first opening 32A and a plurality of protruding portions 44A filling the second openings 34A. The body portion 42A and the protruding portions 44A are of a one-piece structure. Similarly, the contact structure 40B includes the body portion 42B filling the first opening 32B and a plurality of protruding portions 44B filling the second openings 34B, and the body portion 42B and the protruding portions 44B are of a one-piece structure.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
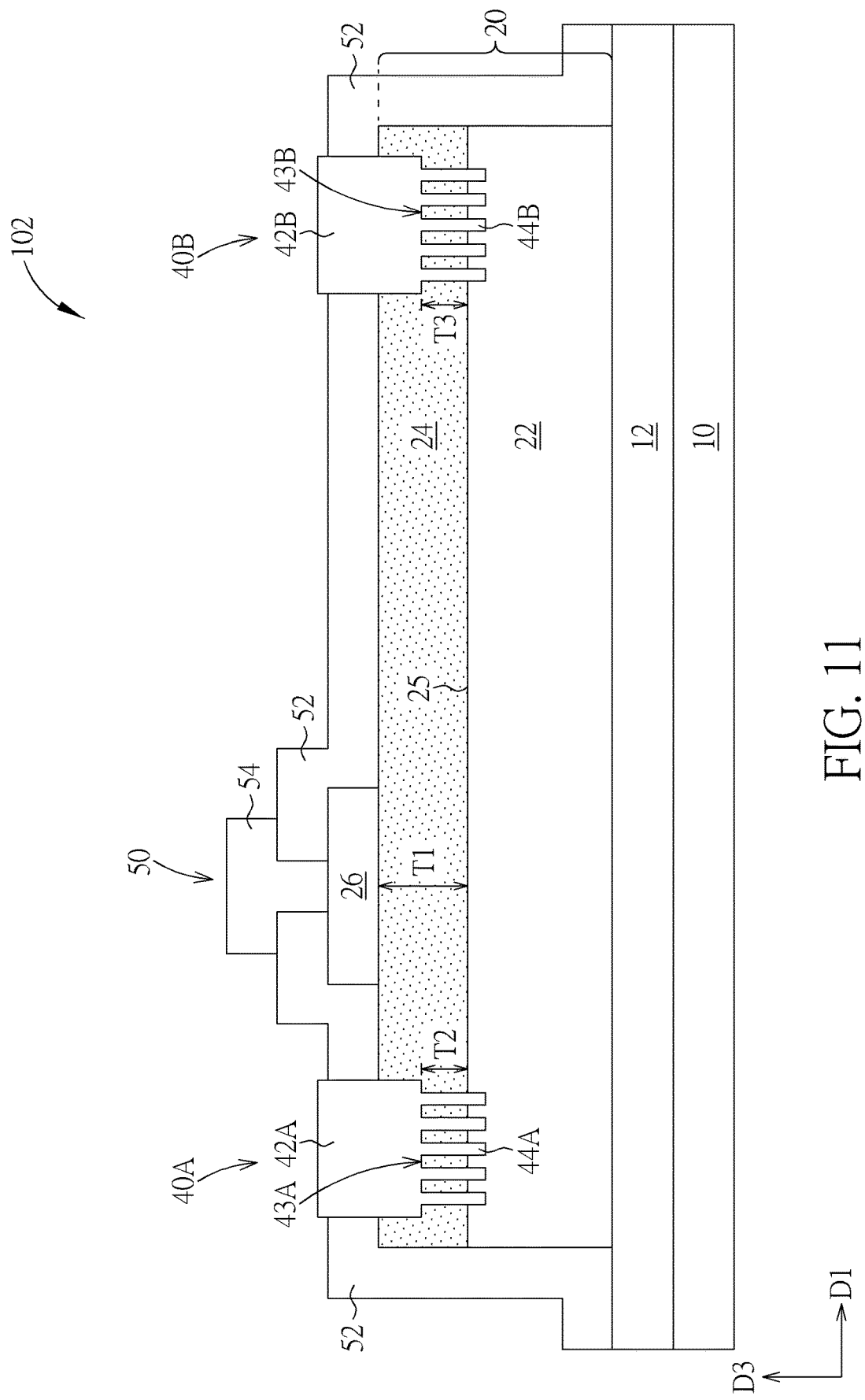
FIG. 11 is a schematic diagram illustrating a cross-sectional view of a high electron mobility transistor according to an embodiment of the present invention.

FIG. 11 is a schematic diagram illustrating a cross-sectional view of a high electron mobility transistor 102 along the first direction D1 and the third direction D3. The differences of the high electron mobility transistor 102 shown in FIG. 11 with respect to the high electron mobility transistor shown in FIG. 10 is that the body portion 42A of the contact structure 40A and the body portion 42B of the contact structure 40B of the high electron mobility transistor 102 may extend into part of the barrier layer 24. As shown in FIG. 11, the bottom surface 43A of the body portion 42A and the bottom surface 43B of the body portion 42B may be lower than the upper surface 24*a* of the barrier layer 24 and located between the upper surface 24*a* and the junction 25. A portion of the barrier layer 24 between the semiconductor gate layer 26 and the channel layer 26 has a thickness T1. A portion of the barrier layer 24 between the body portion 42A and the channel layer 22 has a thickness T2. A portion of the barrier layer 24 between the body portion 42B and the channel layer has a thickness T3. In some embodiments, the thickness T1 is larger than the thickness T2 and the thickness T3. The thickness T2 and the thickness T3 may be equal or different.

Figure 12:
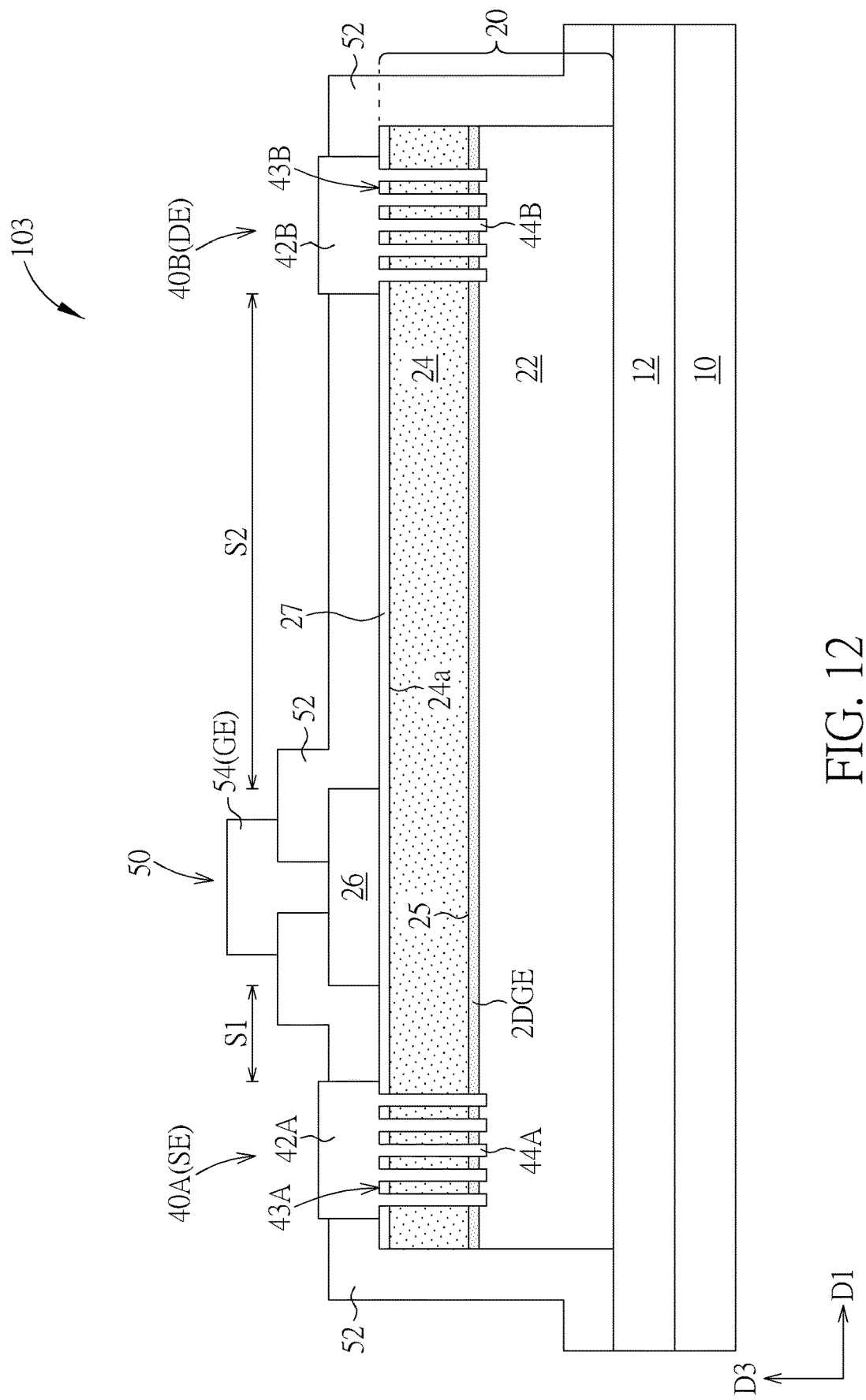
FIG. 12 is a schematic diagram illustrating a cross-sectional view of a high electron mobility transistor according to an embodiment of the present invention.

FIG. 12 is a schematic diagram illustrating a cross-sectional view of a high electron mobility transistor 103 along the first direction D1 and the third direction D3. The differences of the high electron mobility transistor 103 shown in FIG. 12 with respect to the high electron mobility transistor shown in FIG. 10 is that the high electron mobility transistor 103 further includes a dielectric layer 27 disposed between the mesa structure 20 and the gate structure 50 and the passivation layer 52. The dielectric layer 27 separates the barrier layer 24 from the semiconductor gate layer 26 and the passivation layer 52. In some embodiments, the material of the dielectric layer 27 may include aluminum nitride (AlN), aluminum oxide ($Al_2O_3$), boron nitride (BN), silicon nitride ($Si_3N_4$), silicon oxide ($SiO_2$), zirconium oxide ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, other suitable dielectric materials, or a combination thereof. In some embodiments, the dielectric layer 27 includes silicon nitride ($Si_3N_4$) or silicon oxide ($SiO_2$).

Figure 13:
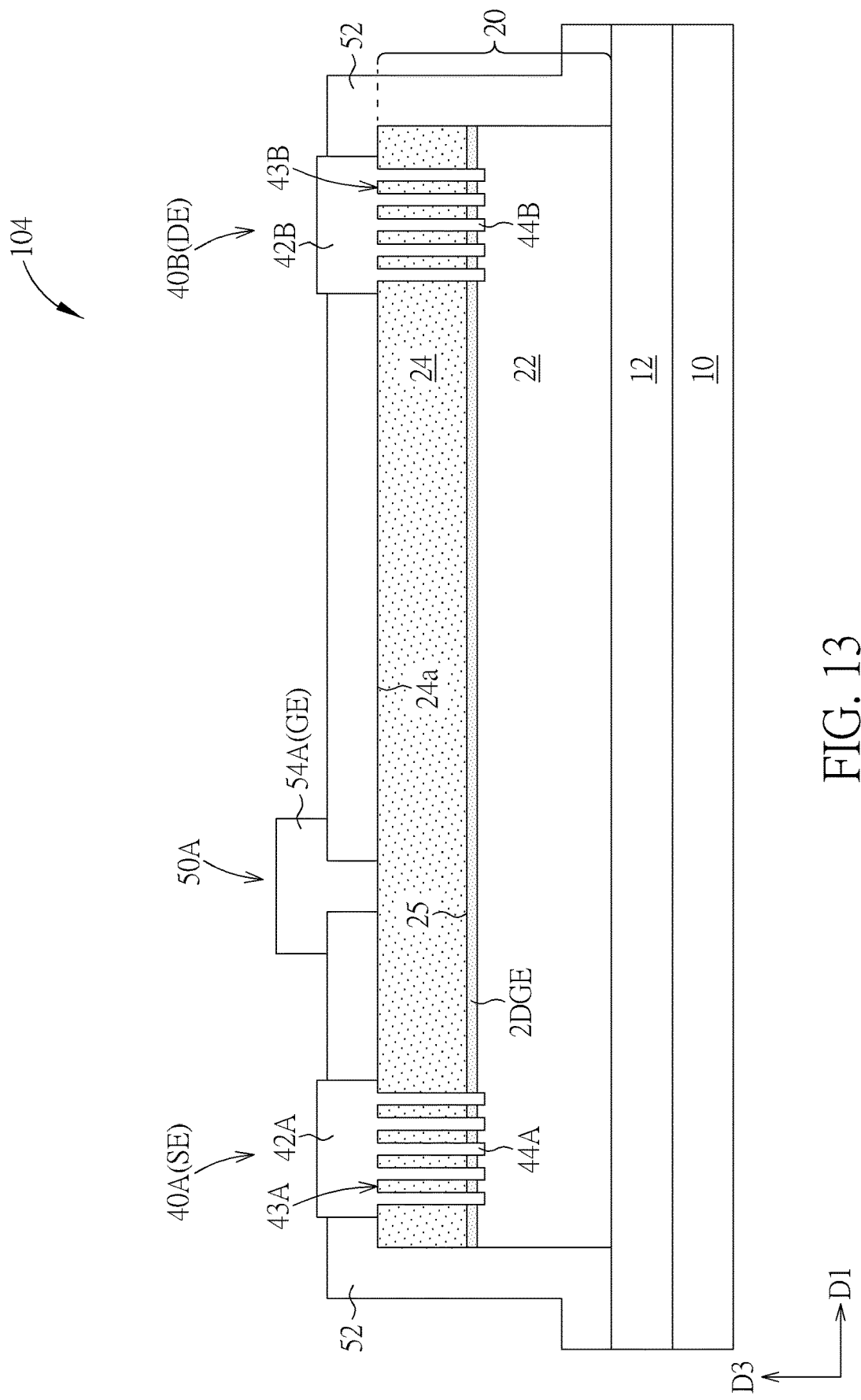
FIG. 13 is a schematic diagram illustrating a cross-sectional view of a high electron mobility transistor according to an embodiment of the present invention.

FIG. 13 is a schematic diagram illustrating a cross-sectional view of a high electron mobility transistor 104 along the first direction D1 and the third direction D3. The differences of the high electron mobility transistor 104 shown in FIG. 13 with respect to the high electron mobility transistor shown in FIG. 10 is that the gate structure 50A of high electron mobility transistor 104 is a metal gate. As shown in FIG. 13, the gate structure 50A may include a metal layer 54A disposed on the mesa structure 20 and in direct contact with the barrier layer 24. The metal layer 54A may include, for example, gold (Au), tungsten (W), cobalt (Co), nickel (Ni), titanium (Ti), molybdenum (Mo), copper (Cu), aluminum (Al), tantalum (Ta), Palladium (Pd), platinum (Pt), a compounds of the above materials, a composite layer of the above materials or an alloy of the above materials, but is not limited thereto. The metal layer 54A is the gate electrode GE of the high electron mobility transistor 104.

Figure 14:
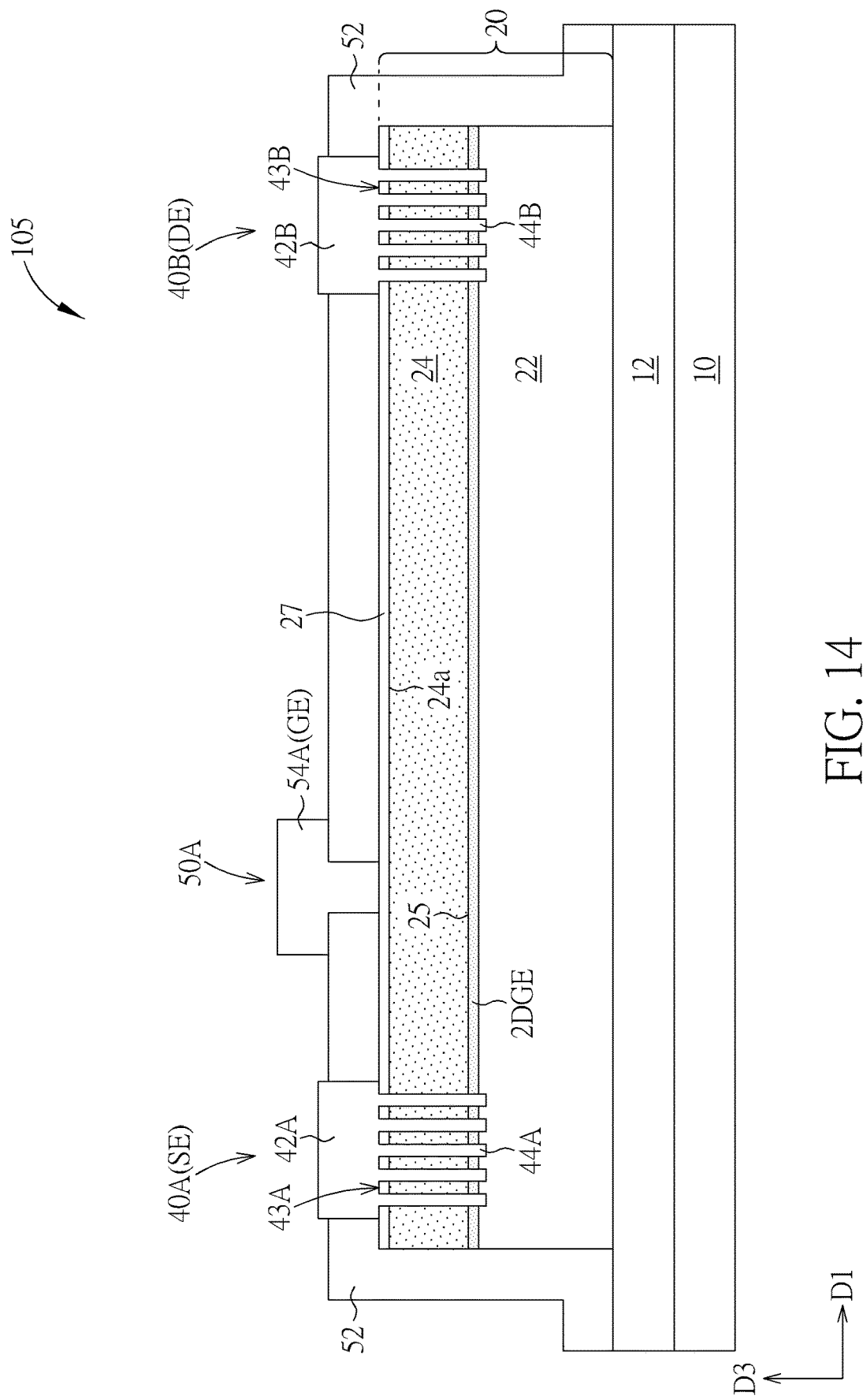
FIG. 14 is a schematic diagram illustrating a cross-sectional view of a high electron mobility transistor according to an embodiment of the present invention.

FIG. 14 is a schematic diagram illustrating a cross-sectional view of a high electron mobility transistor 105 along the first direction D1 and the third direction D3. The differences of the high electron mobility transistor 105 shown in FIG. 14 with respect to the high electron mobility transistor shown in FIG. 13 is that the high electron mobility transistor 105 further includes a dielectric layer 27 disposed between the mesa structure 20 and the gate structure 50A and the passivation layer 52 to separate the barrier layer 24 from the metal layer 54A and the passivation layer 52. The material of the dielectric layer 27 has been illustrated in previous paragraph and will not be redundantly described herein.

Figure 15:
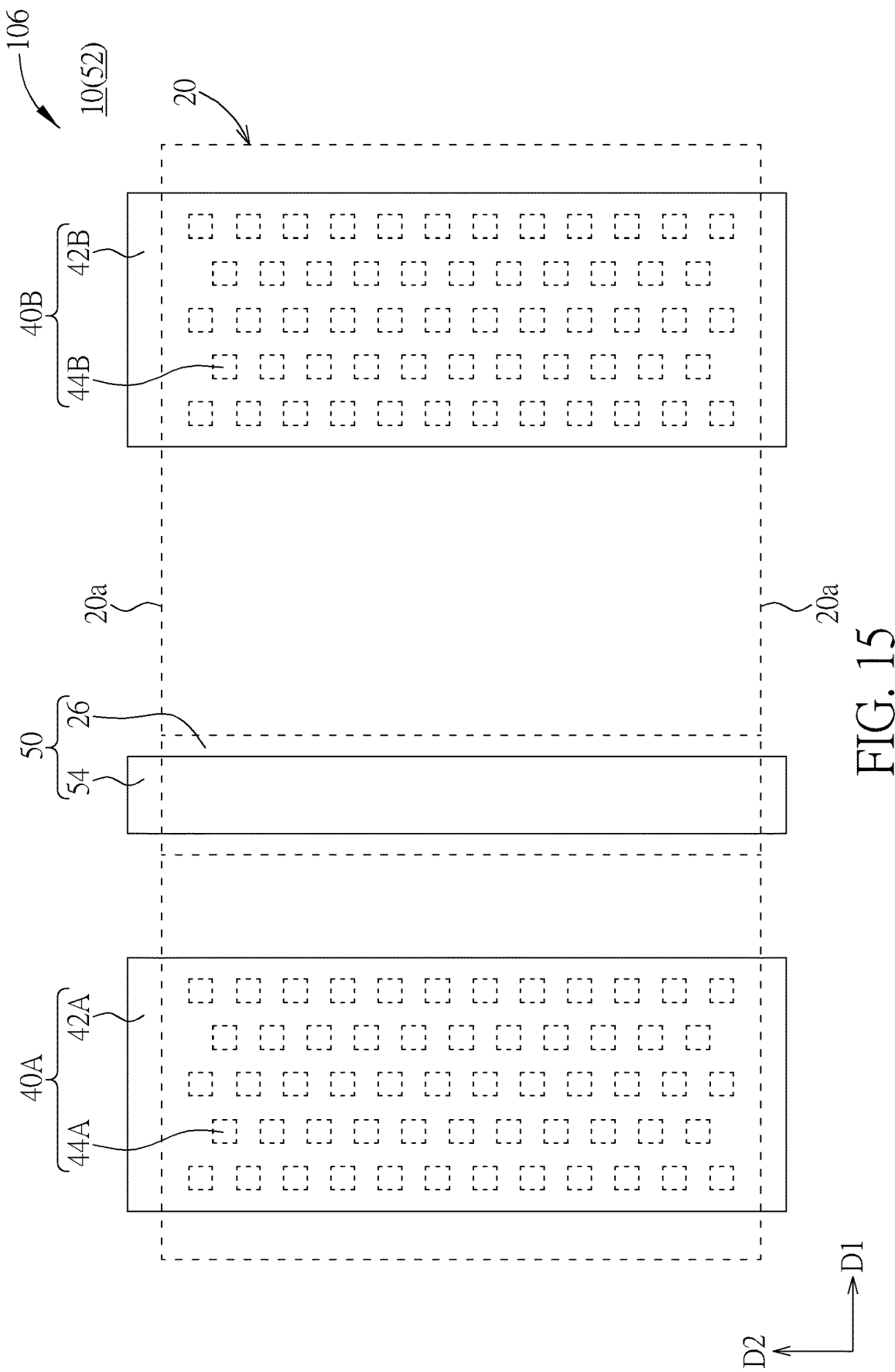
FIG. 15 is schematic diagram illustrating a top plane view of a high electron mobility transistor according to an embodiment of the present invention.
Figure 16:
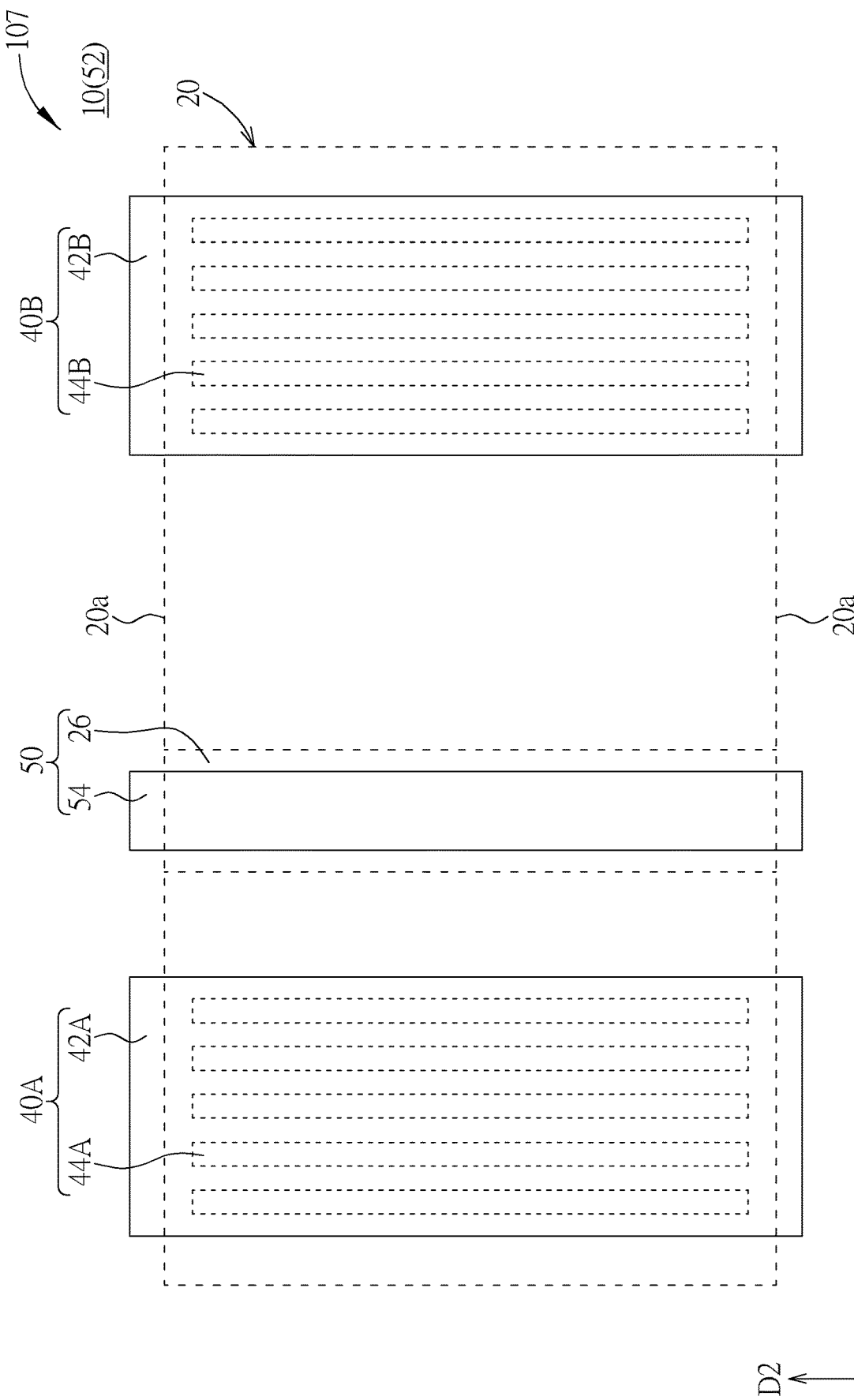
FIG. 16 is schematic diagram illustrating a top plane view of a high electron mobility transistor according to an embodiment of the present invention.
Figure 17:
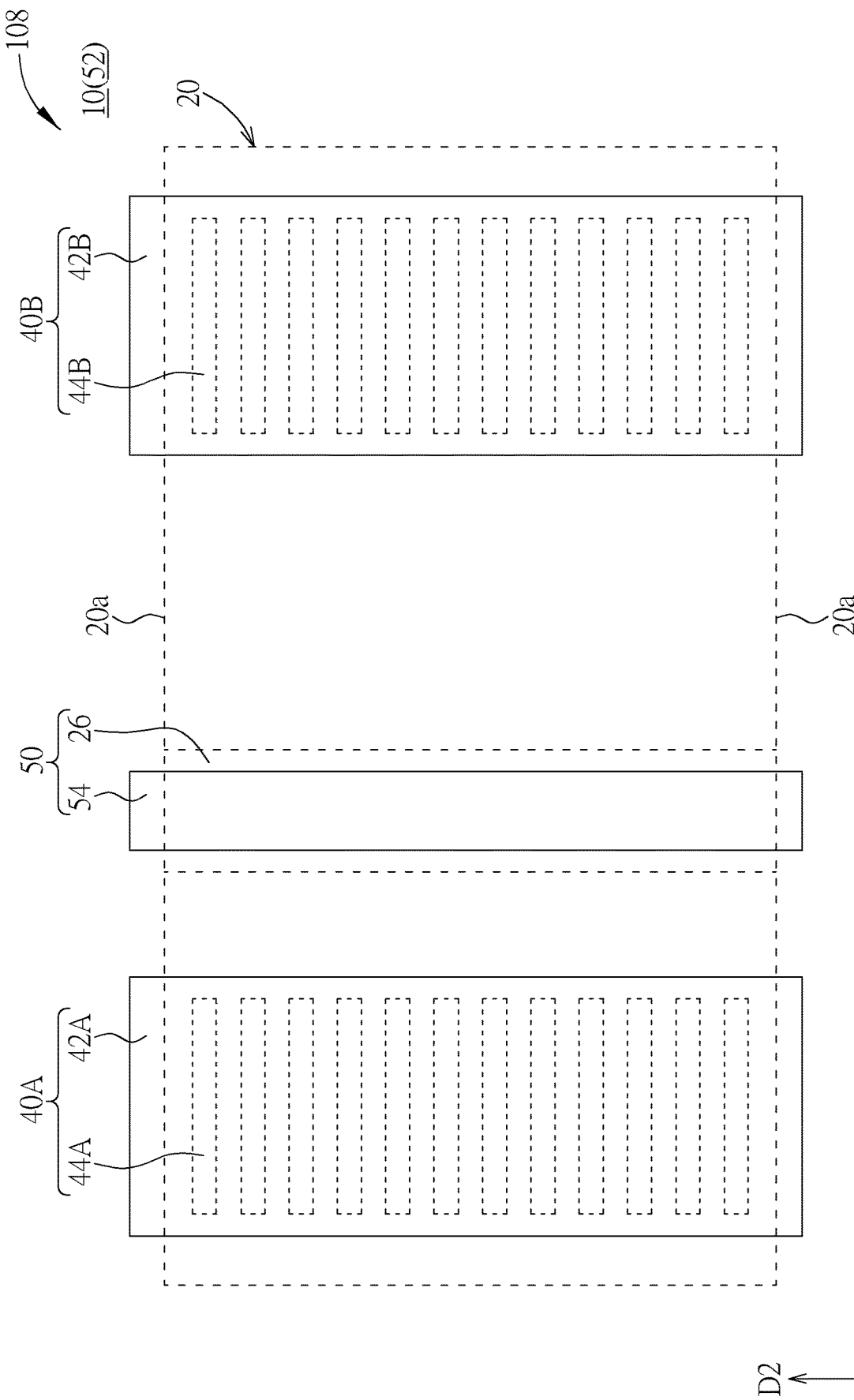
FIG. 17 is schematic diagram illustrating a top plane view of a high electron mobility transistor according to an embodiment of the present invention.

FIG. 15, FIG. 16 and FIG. 17 are schematic diagram illustrating the top plane views of some of the high electron mobility transistors along the first direction D1 and the second direction D2 according to some embodiments of the present invention. The differences between the embodiments shown in FIG. 15, FIG. 16, FIG. 17 and FIG. 9 are the shapes and arrangements of the protruding portions of the contact structures.

Please refer to FIG. 15. The protruding portions 44A of the contact structure 40A and the protruding portions 44B of the contact structure 40B of the high electron mobility transistor 106 are aligned along the second direction D2 and are staggered along the first direction D1, respectively. Please refer to FIG. 16. The protruding portions 44A of the contact structure 40A and the protruding portions 44B of the contact structure 40B of the high electron mobility transistor 107 may have elongated shapes and that extend along a direction (such as the second direction D2) the same as the extending direction of the gate structure 50. Please refer to FIG. 17. The protruding portions 44A of the contact structure 40A and the protruding portions 44B of the contact structure 40B of the high electron mobility transistor 108 may have elongated shapes that extend along a direction (such as the second direction D1) perpendicular to the extending direction of the gate structure 50. Other arrangements and shapes of the protruding portions may be applicable in the present invention based on design requirements.

In conclusion, the present invention provides a high electron mobility transistor with a source electrode and a drain electrode respectively include a contact structure having a body portion and a plurality of protruding portions connected to a bottom surface of the body portion. The body portion penetrates through a passivation layer and is in direct contact with a barrier layer of the high electron mobility transistor. The protruding portions penetrate through the barrier layer and a two-dimensional electron gas (2 DEG) layer of a channel layer of the high electron mobility transistor. This design allows the contact structure to provide stress to the barrier layer and/or the channel layer, and therefore the carrier density and carrier mobility of the two-dimensional electron gas layer may be adjusted. The contact resistance (Rc) of the contact structure with the channel layer may also be reduced. Accordingly, the on-resistance (Rdson) of the high electron mobility transistor may be reduced and a better performance may be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a high electron mobility transistor, comprising:

providing a substrate;

forming a mesa structure on the substrate, wherein the mesa structure comprises a channel layer, a barrier layer disposed on the channel layer, two opposite first edges extending along a first direction, and two opposite second edges extending along a second direction, the first direction and the second direction are perpendicular;

forming a passivation layer covering the substrate and the mesa structure;

forming at least a first opening, wherein the first opening penetrates through the passivation layer and exposes the barrier layer, and in a top view, the first opening exposes the two opposite first edges of the mesa structure without exposing the two opposite second edges of the mesa structure;

forming a plurality of second openings, wherein the plurality of second openings are connected to a bottom surface of the first opening and penetrate through the barrier layer and a portion of the channel layer; and forming a metal layer in the first opening and the plurality of second openings thereby forming a contact structure on the mesa structure; and forming a gate structure on the mesa structure, wherein in the top view, the gate structure is at a side of the contact structure along the first direction, and extends lengthwise along the second direction.

2. The method for forming a high electron mobility transistor according to claim 1, wherein a bottom surface of the first opening is flush with an upper surface of the barrier layer.

3. The method for forming a high electron mobility transistor according to claim 1, wherein the first opening extends into part of the barrier layer.

4. The method for forming a high electron mobility transistor according to claim 1, wherein the plurality of second openings are arranged along the first direction and the second direction to form an array in the top view.

5. The method for forming a high electron mobility transistor according to claim 1, wherein in the top view, the gate structure overlaps the two opposite first edges of the mesa structure.

6. The method for forming a high electron mobility transistor according to claim 1, wherein the step of forming the gate structure comprises:

forming a semiconductor gate layer on the barrier layer of the mesa structure, wherein in the top view, two ends of the semiconductor gate layer are flush with the two opposite first edges of the mesa structure;

covering the semiconductor gate layer with the passivation layer;

forming a gate metal layer through the passivation layer to contact a top surface of the semiconductor gate layer, wherein in the top view, the gate metal layer overlaps the two opposite first edges of the mesa structure.

* * * * *